United States Patent
Heismann

(10) Patent No.: US 6,433,974 B2
(45) Date of Patent: Aug. 13, 2002

(54) CURRENT LIMITING DEVICE WITH PRINTED CONDUCTOR CONFIGURATION OF HIGH $T^c$ SUPERCONDUCTIVE MATERIAL AND METHOD FOR PRODUCING THE DEVICE

(75) Inventor: Björn Heismann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/740,649

(22) Filed: Dec. 18, 2000

Related U.S. Application Data

(63) Continuation of application No. PCT/DE99/01634, filed on Jun. 2, 1999.

(30) Foreign Application Priority Data

Jun. 18, 1998 (DE) .............................. 198 27 227

(51) Int. Cl.$^7$ ................................. H02H 7/00
(52) U.S. Cl. ............................ 361/19; 361/58
(58) Field of Search ................. 361/19, 58; 338/32 S, 338/13

(56) References Cited

U.S. PATENT DOCUMENTS

| | | | | |
|---|---|---|---|---|
| 4,994,932 A | * | 2/1991 | Okamoto et al. ............. | 361/19 |
| 5,694,279 A | * | 12/1997 | Mumford ..................... | 361/19 |
| 5,986,536 A | * | 11/1999 | Ries et al. ................... | 338/13 |
| 6,177,856 B1 | * | 1/2001 | Chen et al. .................. | 338/13 |
| 6,239,957 B1 | * | 5/2001 | McDougall et al. .......... | 361/19 |

FOREIGN PATENT DOCUMENTS

| | | |
|---|---|---|
| DE | 21 15 798 B2 | 10/1992 |
| DE | 195 20 205 A1 | 12/1996 |
| EP | 0 523 374 A1 | 1/1993 |

OTHER PUBLICATIONS

Japanese Patent Abstract No. 06132571 (Fujino Kozo), dated May 13, 1994.
Japanese Patent Abstract No. 01089921 (Yagui Satoru), dated Apr. 5, 1989.
Japanese Patent Abstract No. 01064272 (Yagiu Satoru), dated Mar. 10, 1989.
Noe et al.: "Supraleitende Strombegrenzer in der Energietechnik" [supra conductive current limiting device in energy technology];Elektrie Berlin 1997, pp. 414 to 424.

* cited by examiner

*Primary Examiner*—Stephen W. Jackson
(74) *Attorney, Agent, or Firm*—Laurence A. Greenberg; Werner H. Stemer; Gregory L. Mayback

(57) ABSTRACT

A current limiting device includes a substrate or carrier body at least partially formed of electrically insulating material. At least one printed conductor configuration formed of high $T_c$ superconductive material is disposed on the substrate or carrier body and has end pieces for establishing contact. The printed conductor configuration has a number of partial conductors which are connected in parallel between their end pieces and have at least approximately the same conductor length. A method for producing the device includes forming the printed conductor configuration by structuring a corresponding layer.

12 Claims, 3 Drawing Sheets

CURRENT LIMITING DEVICE WITH PRINTED CONDUCTOR CONFIGURATION OF HIGH $T^C$ SUPERCONDUCTIVE MATERIAL AND METHOD FOR PRODUCING THE DEVICE

CROSS-REFERENCE TO RELATED APPLICATION

This application is a continuation of copending International Application No. PCT/DE99/01634, filed Jun. 2, 1999, which designated the United States.

BACKGROUND OF THE INVENTION

FIELD OF THE INVENTION

The invention relates to a current limiting device including a substrate or carrier body which is at least partially formed of electrically insulating material. At least one printed conductor configuration being formed of metal-oxide high $T_c$ superconducting material is disposed on the substrate or carrier body and has end pieces for establishing contact with connecting conductors. The invention also relates to a method for producing such a current limiting device. A corresponding device and a method for producing it can be found in European Patent Application 0 523 374 A1.

It is not possible to reliably prevent short circuits and electrical flashovers in electrical alternating-current supply systems. The alternating current in the affected circuit then rises very quickly, i.e. in the first half wave of the current, to a multiple of its nominal value until it is interrupted by suitable protection or switching measures. In consequence, considerable thermal and mechanical stresses due to electromechanical forces occur in all system components that are affected, such as lines and busbars, breakers or transformers. Since those short-term loads increase with the square of the current, reliable limiting of the short-circuit current to a lower peak value can considerably reduce the requirements for the load carrying capability of those system components. As a result, cost advantages can be achieved, for example when constructing new systems and extending existing systems. Accordingly, a replacement of system components with structures having higher load carrying capability can be avoided by installing current limiting devices.

The current rise after a short circuit can be limited to a value of a few multiples of the nominal current through the use of superconductive current limiting devices of the resistive type. In addition, such a limiting device is operational again a short time after disconnection. Thus, it acts like a fast self-healing fuse. It also ensures high operational reliability since it acts passively, i.e. it operates autonomously without previous detection of the short circuit and without active triggering by a switching signal. Resistive superconductive current limiting devices of the type mentioned initially form a superconductive switching path or break to be inserted serially into a circuit. In those configurations, the transition of a superconductive printed conductor configuration from a virtually resistanceless cold operating state below a transition temperature $T_c$ of the superconductive material into a normally conductive state above $T_c$ (so-called phase transition) is utilized. In that case, the electrical resistance $R_n$ which then exists in the printed conductor configuration limits the current to an acceptable amplitude $I=U/R_n$. The heating above the transition temperature $T_c$ is performed by the Joule effect in the superconductive material of the printed conductor itself when, after a short circuit, the current density j rises above the critical value $j_c$ of the superconductive material. The material can already have a finite electrical resistance even below the transition temperature $T_c$. In the limiting state above the transition temperature $T_c$, a residual current continues to flow in the circuit containing the current limiting device until an additional mechanical isolator completely interrupts the circuit.

Superconductive current limiting devices being formed of known metal-oxide superconductive materials with a high $T_c$, having a transition temperature $T_c$ which is so high that they can be kept in the superconductive operating state with liquid nitrogen of 77 K, exhibit a fast increase in electrical resistance when the current density $j_c$ is exceeded. Heating into the normally conductive state, and thus current limiting, occurs within a relatively short time so that the peak value of the short circuit current can be limited to a fraction of the unlimited current, for instance from 3 to 10 times the nominal current. The superconductive current path of the printed conductor configuration is in contact with a coolant which is capable of returning it into the superconductive operating state within a relatively short time after the critical current density $j_c$ has been exceeded.

A correspondingly operating resistive current limiting device, which can be found in European Patent Application 0 523 374 A1 mentioned initially, contains a wound meander-shaped electrical conductor of high $T_c$ superconductive material (abbreviated as HTS material) as a printed conductor configuration. The printed conductor configuration is machined, for example, from a 5 mm thick plate of the HTS material through the use of slottings. The electrical conductor is self-supporting but can be disposed on a substrate or carrier body to increase the mechanical stability. Its end pieces are constructed as contact pieces to which external connecting conductors can be connected for the purpose of feeding in the current to be limited.

In such a printed conductor configuration having a single printed conductor inserted serially into a circuit, problems occur with respect to the spatial variation of a critical current density $j_c$ in the superconductive material. In other words, a corresponding distribution of the critical current $I_c(x)$ is produced, where $0<x<1$ and 1 is the length of the printed conductor. The position x having the lowest $I_{c,min}$ then determines not only the critical current $I_{c,tot} \cong I_{c,min}$ of the total printed conductor but also is the first one to become resistive during a dynamic limiting process of a short circuit and, consequently, to become resistively heated the most in the limiting phase. The result is that due to such "weak points" at location x, the maximum switching power is correspondingly low in such current limiting devices.

SUMMARY OF THE INVENTION

It is accordingly an object of the invention to provide a current limiting device with a printed conductor configuration of high $T_c$ superconductive material and a method for producing the device, which overcome the hereinafore-mentioned disadvantages of the heretofore-known methods and devices of this general type, in which the current limiting device can be used to provide a comparatively higher maximum switching power and in which the method provides for the simplest possible production of such a limiting device.

With the foregoing and other objects in view there is provided, in accordance with the invention, a current limiting device, comprising a carrier body at least partially formed of electrically insulating material. At least one printed conductor configuration is disposed on the carrier body and has metal-oxide high $T_c$ superconductive material. The at least one printed conductor configuration has end pieces with a given printed conductor width, for establishing contact with connecting conductors. The at least one printed conductor configuration has n mutually spaced-apart partial conductors connected in parallel between the end pieces and having at least approximately the same conductor length. The n partial conductors each have a printed conductor width reduced at least approximately to an $n^{th}$ part relative to the given printed conductor width of the end pieces.

In fact, in such an embodiment, resistive zones with a lower critical current density $j_c$ are exposed to lower current densities in the individual printed conductors but areas with a higher $j_c$ which are not yet connected are exposed to greater current densities. This results in a correspondingly lower local thermal loading of the weak points due to resistive power dissipation, on one hand, and switching to the normally conductive state which occurs earlier in time and at lower nominal voltages, on the other hand. The superconductive material is therefore advantageously heated more uniformly, is subjected to lower mechanical stresses and faster recooling after the limiting process is made possible. In other words, the advantages associated with the development of the limiting device according to the invention can be seen in that, in the case of overcurrents, and thus in the limiting case, a current distribution is achieved which reduces the significance of the $j_c$ variation and of the weak points.

In accordance with another feature of the invention, the partial conductors of the printed conductor configuration are disposed on the substrate or carrier body in such a manner that the greatest portion of each partial conductor only occupies a surface area of the substrate or carrier body which is allocated to it and which is spatially separate from the surface area allocated to every other partial conductor. This advantageously makes it possible to ensure the greatest possible spatial separation of the individual partial conductors or their current paths which lead to a correspondingly more uniform resistive heating during a phase transition from the superconductive to the normally conductive state.

This effect can be achieved, in particular, when the printed conductor configuration has at least three parallel-connected partial conductors.

With the objects of the invention in view, there is also provided a method for producing a current limiting device, which comprises forming the at least one printed conductor configuration by structuring at least one layer of metal-oxide high $T_c$ superconductive material directly or indirectly applied on the carrier body.

In accordance with a concomitant mode of the invention, the individual partial conductors can be constructed in a relatively simple manner through the use of physical or chemical patterning or structuring processes that are known per se.

Other features which are considered as characteristic for the invention are set forth in the appended claims.

Although the invention is illustrated and described herein as embodied in a current limiting device with a printed conductor configuration of high $T_c$ superconductive material and a method for producing the device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
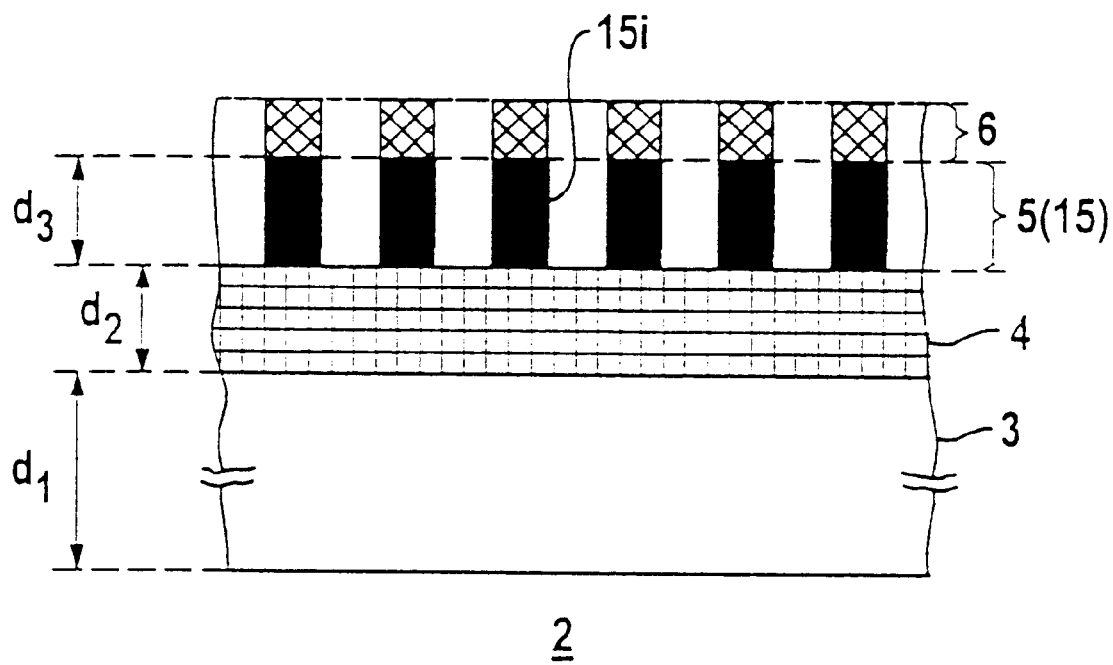
FIG. 1 is a fragmentary, diagrammatic, cross-sectional view of a part of a current limiting device.

Referring now in detail to the figures of the drawings, in which corresponding parts are provided with the same reference symbols, there is seen a current limiting device according to the invention which is based on embodiments of such devices that are known per se, for example from European Patent Application 0 523 374 A1 mentioned initially or German Published, Non-Prosecuted Patent Application DE 195 20 205 A. A basic configuration of this device is indicated by a fragmentary cross section through such a device in FIG. 1. An assembly generally designated by reference numeral 2 includes a substrate or carrier body 3 having a thickness $d_1$ and possibly at least one intermediate layer 4 having a thickness $d_2$ which is applied thereto. This intermediate layer 4 should be considered as part of the substrate or carrier body. A layer 5 of an HTS material having a thickness $d_3$, which is patterned or structured according to the invention, is applied or precipitated thereon. The HTS layer can be covered with at least one further cover layer such as, e.g., a protective layer or a layer 6 serving as shunt resistance. Such a shunt resistance layer is particularly advantageous for current limiter applications, especially in the case where an insulating substrate or carrier body is used.

The substrate or carrier body 3 can be formed by a planar or possibly also curved substrate body such as, e.g., in tubular form. It is formed at least partially of an electrically insulating material. Materials suitable for this purpose are ceramics such as, e.g., MgO, $SrTiO_3$, $Al_2O_3$ or $ZrO_2$ stabilized with Y (abbreviated as "YSZ"). Particularly advantageously, substrate or carrier bodies of a special glass material are provided, especially if the bodies in question have a large area. For example, a corresponding plate can have a thickness $d_1$ of a few millimeters. In addition, substrate or carrier bodies composed of metallic or electrically insulating material are also suitable. The intermediate layer 4 may be required to be formed of an electrically insulating material, especially in a case where metallic parts are used for the substrate or carrier body. Such an intermediate layer may also be needed as a so-called buffer layer. Such a layer is provided, on one hand, in order to prevent an interaction between the HTS material to be applied to it and the substrate or carrier body material and, on the other hand, to promote a texture of the HTS material to be applied. Known buffer layer materials, which are generally used in a thickness of between 0.1 and 2 $\mu$m, are YSZ, YSZ+$CeO_2$ (as a double layer), YSZ+Sn-doped $In_2O_3$ (as a double layer), $CeO_2$, $Pr_6O_{11}$, MgO, $SrTiO_3$ or $La_{1-x}Ca_xMnO_3$.

All known metal-oxide superconductive materials with a high $T_c$ such as, in particular, $YBa_2Cu_3O_{7-x}$ and $RBa_2Cu_3O_{7-x}$ (where R is a rare earth metal), $TlBa_2Ca_2Cu_3O_{9+x}$, $HgBa_2CaCu_2O_{6+x}$, $Bi_2Sr_2CaCu_2O_{8-x}$ or $(Bi, Pb)_2Sr_2Ca_2Cu_3O_{11-x}$ can be used as HTS materials.

Naturally, other elements can be substituted at least partially for individual components or a number of components of these materials in a known manner. These materials are applied with a thickness $d_3$ which can generally be up to a few µm.

As is also indicated in FIG. 1, at least the HTS layer is intended to be patterned or structured in a special manner to form a conductor configuration 15. All physical or chemical methods known for this purpose can be used as the patterning or structuring process. For example, the patterning or structuring can be performed through the use of a laser. After the patterning or structuring process, the printed conductor configuration 15 exhibits a number of partial conductors $15_i$.

Figure 2:
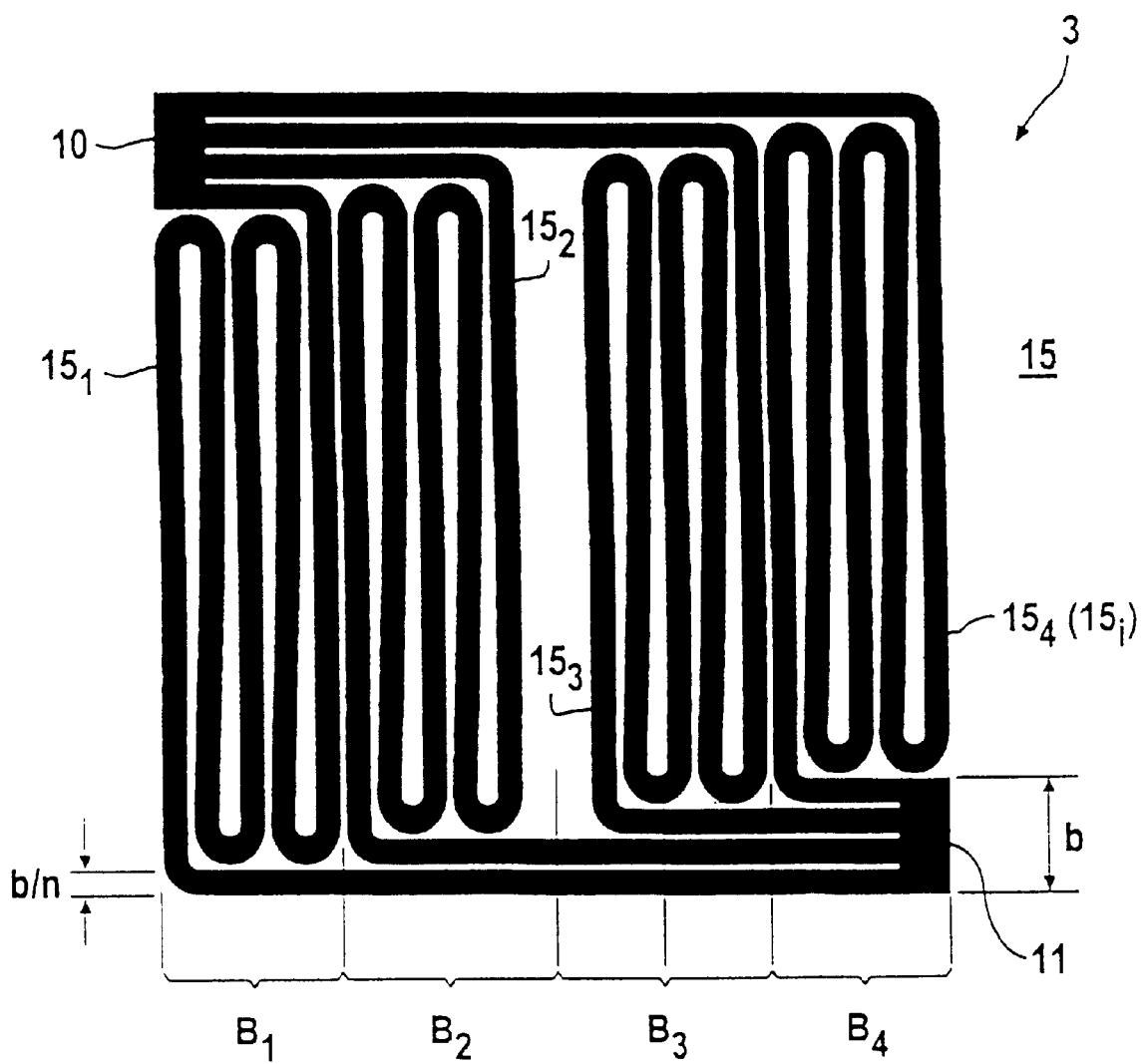
FIG. 2 is a top-plan view of a printed conductor configuration of the current limiting device.

The top view of FIG. 2 shows an actual possibility for constructing the printed conductor configuration 15 of a current limiting device with a subdivision of the current path according to the invention into n parallel-connected, at least largely equally long, current paths. The conductor configuration includes two end pieces 10 and 11 having a width b for establishing contact with connecting conductors in known manner. It is seen that n=4 parallel-connected partial conductors $15_i$ extend between these end pieces, where $1 \leq i \leq n$. The printed conductor width in the area of these partial conductors is approximately b/n. The course of these partial conductors is advantageously provided in such a manner that the greatest possible spatial separation between the partial conductors is achieved. According to the exemplary embodiment shown, this is achieved in such a way that a separate surface area $B_1$ to $B_4$ of the substrate or carrier body 3 is allocated to each of the partial conductors $15_1$ to $15_4$. The most essential part of the respective partial conductor, aside from the direct connecting parts with the end pieces, extends in each of these surface areas. Within the areas, each of the partial conductors advantageously extends essentially in a meander shape.

Reducing the printed conductor width b to b/n in the area of the partial conductors $15_i$ leads, on one hand, to microscopic variations in a critical current density $j_c$ only playing a small role. Therefore, in the case of switching, the printed conductor configuration usually becomes resistive at more than n positions even at low nominal voltages, and local overtemperatures are also correspondingly lower. On the other hand, the individual current paths having the index i receive different critical currents $I_c(i)$ in accordance with a macroscopic $j_c$ variation due to the spatial separation. Then, in the case of a current rise during a switching process, if the path i having the lowest critical current $I_c(i)$ becomes resistive at a weak point, a corresponding path resistance R(i) increases and the current is increasingly distributed to the remaining paths. As a result, the current will flow around this weak point, as it were. The power $P(i)=I^2(i)R(i)$ deposited in the path is correspondingly reduced and the remaining paths will switch earlier in time and with respect to the voltage applied due to the higher current loading. Consequently, the printed conductor configuration allows the current distribution to respond in a stress-reducing manner to the dynamic addition of resistive path bridges. It can be found that, due to these characteristics, the phase transition and the resistive heating during a switching process are advantageously spatially homogenized during a switching process. A total critical current $I_{c,tot}$ of a parallel configuration also increases noticeably as compared with a serial configuration so that higher nominal currents, and thus correspondingly higher switching powers, become possible, with the path lengths remaining approximately the same.

Figure 3:
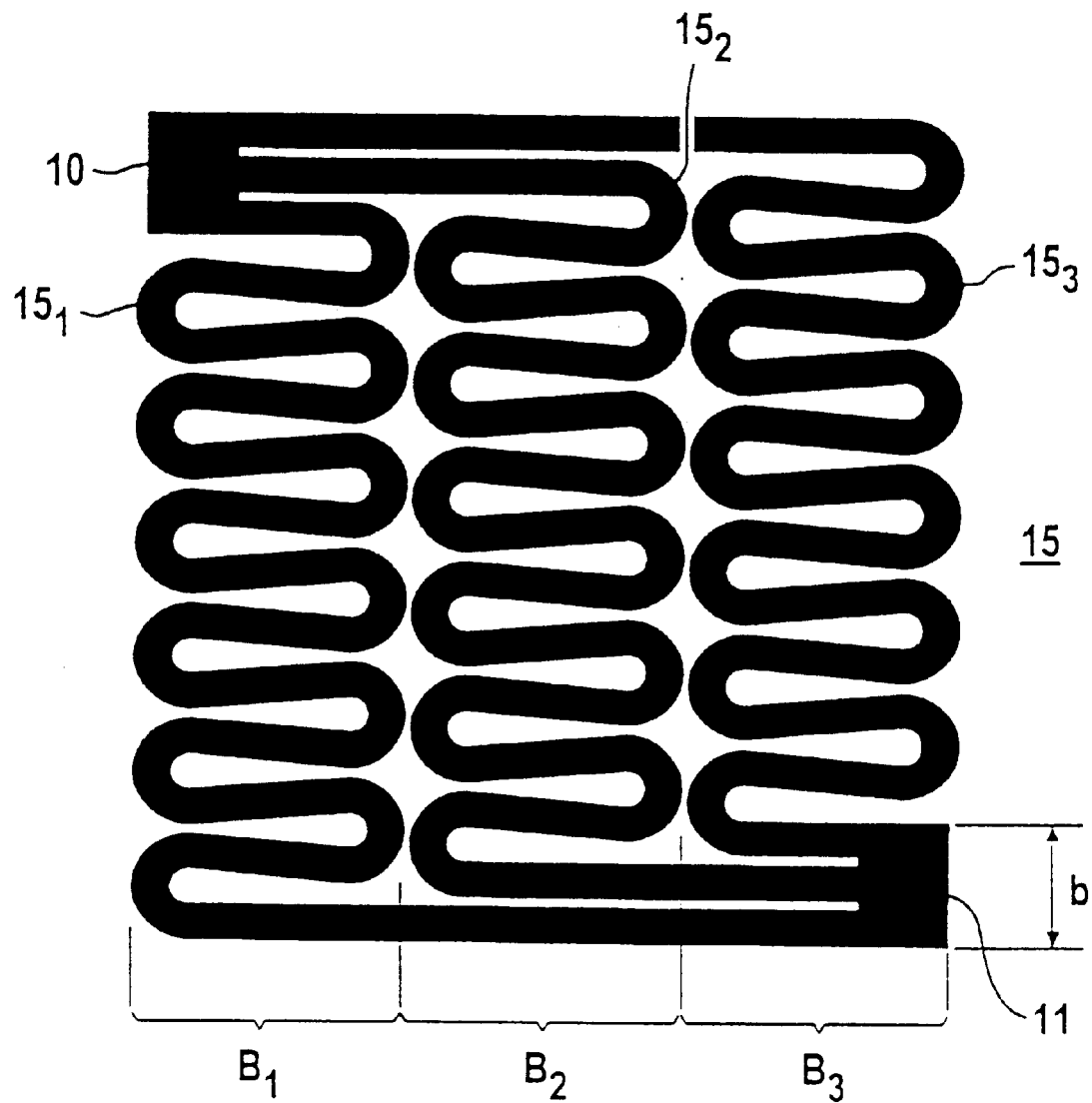
FIG. 3 is a top-plan view of another embodiment of a printed conductor configuration.

An embodiment of a printed conductor configuration 15 shown in FIG. 3 differs from that according to FIG. 2, on one hand in the number n=3 of subdivisions of the conductor configuration resulting in three partial conductors $15_1$ to $15_3$ in surface areas $B_1$ to $B_3$. On the other hand, meander-shaped conductor turns in the individual surface areas extend with a rotation of 90° as compared with the course of the conductor turns according to FIG. 2.

According to an actual example of the two embodiments of conductor configurations 15 for HTS current limiter devices according to FIGS. 2 and 3, a width b of the undivided printed conductor of about 1.2 cm and a respective total length of the current paths of about 66 and 65 cm can be provided. Using corresponding printed conductor configurations 15, nominal currents of about 1000 A can then be switched by using the HTS material $YBa_2Cu_3O_{7-x}$ with a critical current density $j_c$ of approximately $10^4 A/cm^2$. In this configuration, the individual current paths form areas which, on average, are a number of centimeters distant from one another and are thus within the order of magnitude of the macroscopic $j_c$ fluctuations of the HTS layer.

In the embodiments of current limiting devices according to the invention that are explained with reference to the figures, it was assumed that their conductor configurations are each only applied to one side of a substrate or carrier body. Naturally, it is also possible to occupy the opposite areas of a substrate or carrier body on both sides with a single printed conductor configuration or with a number of is printed conductor configurations.

I claim:

1. A current limiting device, comprising:
    a carrier body at least partially formed of electrically insulating material;
    at least one printed conductor configuration disposed on said carrier body and having metal-oxide high $T_c$ superconductive material;
    said at least one printed conductor configuration having end pieces with a given printed conductor width, for establishing contact with connecting conductors;
    said at least one printed conductor configuration being subdivided between said end pieces into n mutually spaced-apart partial conductors connected in parallel between said end pieces and having at least approximately the same conductor length; and
    said n partial conductors each having a printed conductor width reduced at least approximately to an $n^{th}$ part relative to said given printed conductor width of said end pieces.

2. The current limiting device according to claim 1, wherein each of said partial conductors of said at least one printed conductor configuration disposed on said carrier body have a largest part occupying a surface area of said carrier body being exclusively assigned to it and being spatially separate from surface areas assigned to every other one of said partial conductors.

3. The current limiting device according to claim 2, wherein said partial conductors extend substantially in a meander shape in said surface areas.

4. The current limiting device according to claim 1, wherein said carrier body is formed of a material selected from the group consisting of ceramic material and glass material.

5. The current limiting device according to claim 1, wherein said carrier body has at least one intermediate layer acting as a base for said at least one printed conductor configuration.

6. The current limiting device according to claim 1, including at least one further layer covering said at least one printed conductor configuration.

7. The current limiting device according to claim 1, wherein said carrier body has two sides, and said at least one printed conductor configuration includes at least one printed conductor configuration disposed on both of said sides of said carrier body.

8. A method for producing a current limiting device, which comprises:

forming a carrier body at least partially of electrically insulating material;

forming at least one printed conductor configuration by structuring at least one layer of metal-oxide high $T_c$ superconductive material applied on the carrier body;

providing the at least one printed conductor configuration with end pieces having a given printed conductor width, for establishing contact with connecting conductors;

subdividing the at least one printed conductor configuration between the end pieces into n mutually spaced-apart partial conductors connected in parallel between the end pieces and having at least approximately the same conductor length; and providing each of the n partial conductors with a printed conductor width reduced at least approximately to an $n^{th}$ part relative to the given printed conductor width of the end pieces.

9. The method according to claim 8, which further comprises carrying out the step of forming the at least one printed conductor configuration by directly applying the at least one layer of the high $T_c$ superconductive material to the carrier body.

10. The method according to claim 8, which further comprises carrying out the step of forming the at least one printed conductor configuration by indirectly applying the at least one layer of the high $T_c$ superconductive material to the carrier body.

11. The method according to claim 8, which further comprises carrying out the structuring step in a physical process.

12. The method according to claim 8, which further comprises carrying out the structuring step in a chemical process.

* * * * *